(12) United States Patent
Koren et al.

(10) Patent No.: US 8,143,943 B2
(45) Date of Patent: *Mar. 27, 2012

(54) SYSTEM AND A METHOD FOR SIGNAL PROCESSING

(75) Inventors: Doron Shahar Koren, Rishon Le Zion (IL); Sergey Toujikov, Rishon Le Zion (IL)

(73) Assignee: Vyycore Ltd., Petach Tikva, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/952,218

(22) Filed: Nov. 23, 2010

(65) Prior Publication Data

US 2011/0148520 A1 Jun. 23, 2011

Related U.S. Application Data

(63) Continuation of application No. 12/499,111, filed on Jul. 8, 2009, now Pat. No. 7,948,310.

(60) Provisional application No. 61/224,101, filed on Jul. 9, 2009.

(51) Int. Cl.
*H03F 1/26* (2006.01)
(52) U.S. Cl. ........................................ 330/149; 375/296
(58) Field of Classification Search .................. 330/149; 375/296–297; 455/144.3; 327/133
See application file for complete search history.

(56) References Cited

U.S. PATENT DOCUMENTS 6,998,909 B1 * 2/2006 Mauer ............................... 330/2
7,333,559 B2 * 2/2008 Song et al. ..................... 375/296

* cited by examiner

*Primary Examiner* — Hieu Nguyen
(74) *Attorney, Agent, or Firm* — Oren Reches

(57) ABSTRACT

A system for processing an input signal, the system includes: a hardware memory module configured to store a lookup table; and a signal processing module, configured to process the input signal to provide a second signal, and to transmit the second signal to a power amplifier that is characterized by non-linearity and which is adapted to amplify the second signal to provide an amplified signal; wherein the signal processing module is configured to process the input signal in response to at least one filtering parameter to provide the second signal so as to at least partly compensate for the non-linearity of the amplifier; wherein the at least one filtering parameter is retrieved from the lookup table using a first, a second, and a third lookup table indexes, wherein the first index is responsive to a magnitude of the input signal at a first moment, the second index is responsive to a magnitude of the input signal at a second moment, and the third index is responsive to phases of the input signal at the first and the second moments; wherein the system includes a delay circuit for delaying the input signal before the input signal is provided to the signal processing module.

12 Claims, 3 Drawing Sheets

SYSTEM AND A METHOD FOR SIGNAL PROCESSING

RELATED APPLICATIONS

This patent application is a continuation of U.S. patent application Ser. No. 12/499,111 filed on Jul. 8, 2009 that was granted on May 24, 2011 to U.S. Pat. No. 7,948,310, which is incorporated herein by reference. This patent application claims the priority of U.S. provisional patent 61/224,101 filing date Jul. 9, 2009, which is incorporated herein by reference.

BACKGROUND OF THE INVENTION

Power amplifiers which amplify electric signals may be characterized by non-linearity of the amplification, usually (though not necessarily) when the signal inputted to the amplifier comes closer to a saturation threshold of the amplifier. Preprocessing of the input signal before it reaches the amplifier (also known as predistorting) may be implemented to overcome such non-linearity. However, prior art solutions for predistorting a signal before amplification are slow, cumbersome, requires a great computational power, and/or not sufficiently effective. There is therefore a great need for simple and effective means of amplification.

SUMMARY OF THE INVENTION

A system for processing an input signal, the system includes: a hardware memory module configured to store a lookup table; and a signal processing module, configured to process the input signal to provide a second signal, and to transmit the second signal to a power amplifier that is characterized by non-linearity and which is adapted to amplify the second signal to provide an amplified signal; wherein the signal processing module is configured to process the input signal in response to at least one filtering parameter to provide the second signal so as to at least partly compensate for the non-linearity of the amplifier; wherein the at least one filtering parameter is retrieved from the lookup table using a first, a second, and a third lookup table indexes, wherein the first index is responsive to a magnitude of the input signal at a first moment, the second index is responsive to a magnitude of the input signal at a second moment, and the third index is responsive to phases of the input signal at the first and the second moments; wherein the system includes a delay circuit for delaying the input signal before the input signal is provided to the signal processing module.

A method for processing an input signal, the method may include: retrieving from a lookup table at least one filtering parameter using a first, a second, and a third lookup table indexes, wherein the first index is responsive to a magnitude of the input signal at a first moment, the second index is responsive to a magnitude of the input signal at a second moment, and the third index is responsive to phases of the input signal at the first and the second moments; processing, by a signal processing module, the input signal in response to the at least one filtering parameter, to provide a second signal; and transmitting the second signal to a power amplifier that is characterized by non-linearity and which is adapted to amplify the second signal to provide an amplified signal; wherein the processing comprises processing the input signal to provide the second signal so as to at least partly compensate for the non-linearity of the amplifier. Wherein the method includes delaying the input signal before the input signal is provided to the signal processing module.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
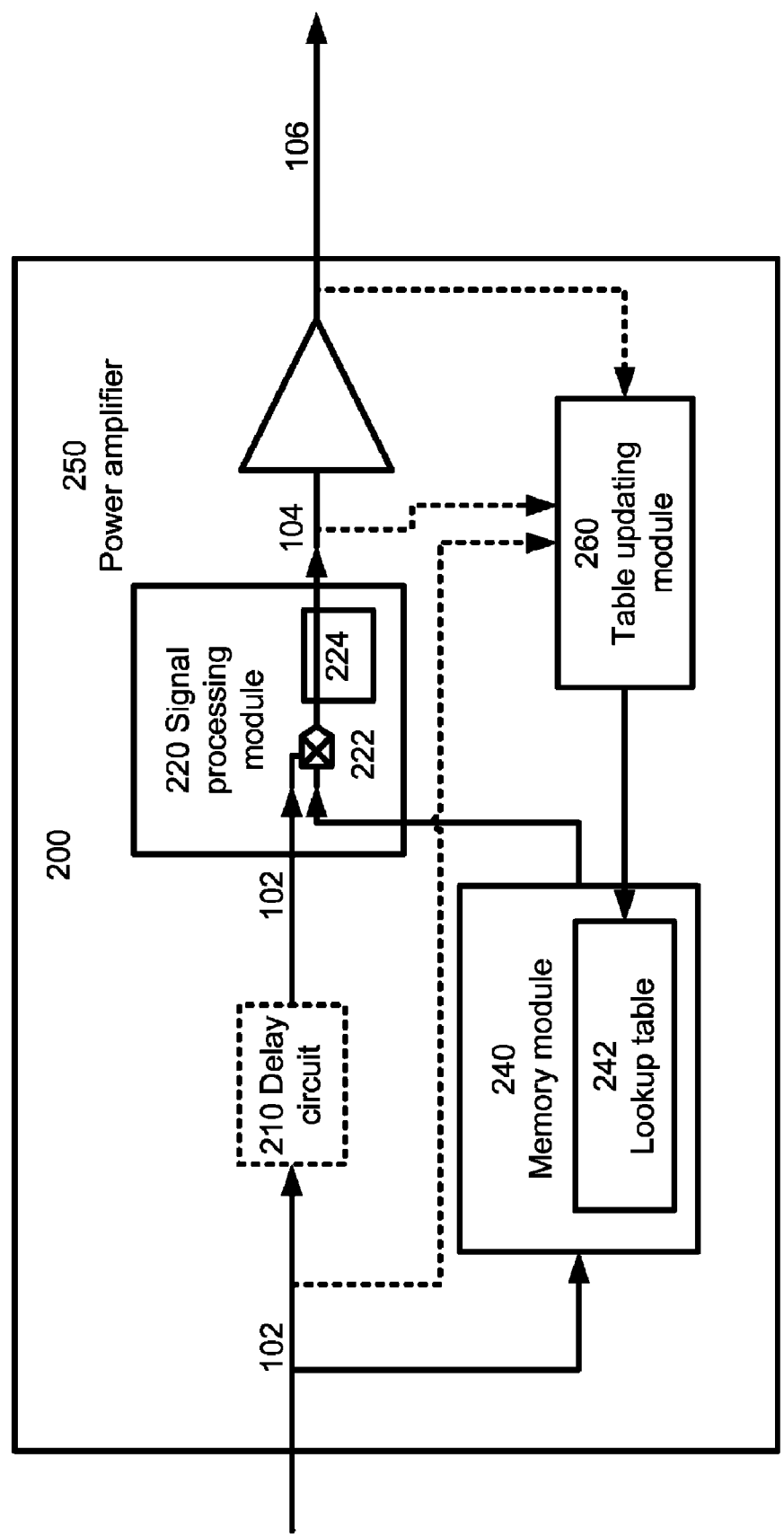
FIG. 1 illustrates a system for processing an input signal, according to an embodiment of the invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE PRESENT INVENTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

FIG. 1 illustrates system 200 for processing an input signal, according to an embodiment of the invention. System 200 includes signal processing module 220 that receives an input signal 102, processes it (possibly only if required), and provides a second signal (denoted 104 in the diagram), to be amplified by power amplifier 250. It is noted that signal processing module 220 may include hardware, software, and/or firmware components, and any combination thereof. It is noted that conveniently, the processing of the signal may be carried out by hardware components of signal processing module 220, such as a hardware signal multiplier.

Signal processing module 220 is further configured to transmit the second signal to a power amplifier (which may be external to system 200, and may be a component of which, e.g. power amplifier 250) that is characterized by non-linearity and which is adapted to amplify the second signal 104 to provide an amplified signal (e.g. amplified signal 106).

System 200 includes hardware memory module 240 which configured to store a lookup table 242 (also referred to as LUT 242). Lookup table 242 stores different filtering parameters that should be used for the processing of the input signal by signal processing module 220 in different situations.

Signal processing module 240 is configured to process input signal 102 in response to at least one filtering parameter to provide the second signal 104 so as to at least partly compensate for the non-linearity of the power amplifier; wherein the at least one filtering parameter is retrieved from the lookup table using a first, a second, and a third lookup table indexes, wherein the first index is responsive to a magnitude of the input signal at a first moment, the second index is responsive to a magnitude of the input signal at a second moment, and the third index is responsive to phases of the input signal at the first and the second moments.

The retrieving may be carried out by signal processing module 220 or components thereof, by retrieving module of memory module 240 (not shown), or in any other way that is known in the art.

System 200 may or may not include power amplifier 250, that is characterized by the non-linearity. The non-linearity of power amplifier 250 may occur in one or more parts of its operational range, or in the entire operational range, without limiting the scope of the invention.

Signal processing module 220 may conveniently operate as a pre-distorter filter (or signal processor) for the power amplifier (referred to below as power amplifier 250, even though an external amplifier may be used), processing an input signal (denoted 102 in the diagram) before it is provided to power amplifier 250, so the output signal (denoted 106 in the diagram, also referred to as amplified signal) provided after amplification by power amplifier 250 is sufficiently linear in respect to the input signal. The degree of linearity between the input and output signals may differ in different implementations of the invention, and in different times, but it is generally substantially more linear than the linearity possible by power amplifier 250 itself.

The retrieving of the at least one filtering parameter from lookup table 242 is conveniently relatively fast and requires a relatively small amount of computational power. According to an embodiment of the invention, lookup table 242 is a three dimensional lookup table (and memory module 240 is configured to store a three dimensional lookup table), in which every group of at least one filtering parameter that is used for filtering is retrievable using three indexes, two of which are magnitude related, and one of which is phase related, as discussed above.

The at least one filtering parameter which is retrieved from lookup table 242 for filtering by signal processing module 220 may consist, according to an embodiment of the invention, of a complex compensation coefficient, wherein signal processing module 220 is configured to multiply the input signal by the compensation coefficient for the generating of the second signal (e.g. by a multiplier 222). It is noted that multiplying the entire input signal by a single complex compensation coefficient (or multiplying components of the complex input signal by two real parameters, which correspond to a complex parameter) is conveniently a relatively fast and not complex way of filtering the input signal.

It is noted that the at least one filtering parameter may be provided to signal processor 220 as an electric signal which can be analogously used for processing the input signal using the electric signal and analogue signal processing technique. For example, electric parameters of the electric signal that is responsive to the at least one filtering parameter—e.g. amplitude, phase, magnitude—may indicate of a value of the at least one parameter. Such signal may be generated by memory module 240, or by an additional signal generating or processing module (not illustrated).

According to an embodiment of the invention, the input signal may be provided to signal processing module 220 after being delayed by a delay circuit 210 (which may include, for example, a flip-flop), e.g. so the input signal will timely reach processing when the at least one filtering parameter reaches signal processing module 220 or a sub-module of which.

As aforementioned, the first index is responsive to a magnitude of the input signal at a first moment ($M_{t1}$), and the second index is responsive to a magnitude of the input signal at a second moment ($M_{t2}$), wherein the magnitude may be calculated as known in the art (e.g. $M=\text{sqrt}(I^2+Q^2)$)

It is noted that as the first signal may conveniently be a digital signal, the magnitude of the signal is sampled in discrete sampling times (usually in a constant sampling frequency, but not necessarily so). According to an embodiment of the invention, the first and the second moments are consecutive moments of a discrete sampling scheme. That is, the second magnitude value, taken at the second moment, may be in taken in a consecutive sample to the first moment in which the first magnitude value is taken. It is noted that the number of samples between the first and the second moment may differ than one, in different embodiments of the invention, and that it is may or may not change between the filtration of the signal in different times.

It is noted that while more than two magnitude samples may be determined and utilized for the retrieval of the filtering parameters from a lookup table (using additional indexes, on top of the first and the second indexes), the added value of such additional samples (e.g. $M_{t3}$, $M_{t4}$) is usually not as valuable for the retrieval of efficient filtering parameters. Therefore, the phase dependent third index is being utilized. Using magnitude of different times counts for memory of the channel, and may be used, for example, to overcome non-linearities which result from a memory of the physical channel (e.g. amplifier 250 or other components, either of system 200 or external to it).

As aforementioned, the third index is responsive to phases of the input signal at the first and the second moments. According to an embodiment of the invention, the third index is responsive to a difference between the phases of the input signal at the first and the second moments (also denoted $\Delta\varphi$).

It is noted that beside processing the input signal in response to the at least one filtering parameter retrieved from lookup table 242 (a processing which may conveniently be intended to overcome an expected non-linearity of power amplifier 250, as well as of other components of the system that participates in transmitting and/or processing the signal as it is being transmitted), other types of processing may be applied to the signal before it is being transmitted to power amplifier 250.

For example, the signal transmitted may be converted from a digital signal to an analogue signal, by upconverting the signal, low-pass filtering, and other filtering, processing and manipulating techniques that are known in the art. Such additional filtering may be carried out, according to an embodiment of the invention, by one or more filtering modules 224. It is noted that the filtering may compensate for non-linearity (or other imperfections) of such components as well, and not only of power amplifier 250 itself.

Figure 2:
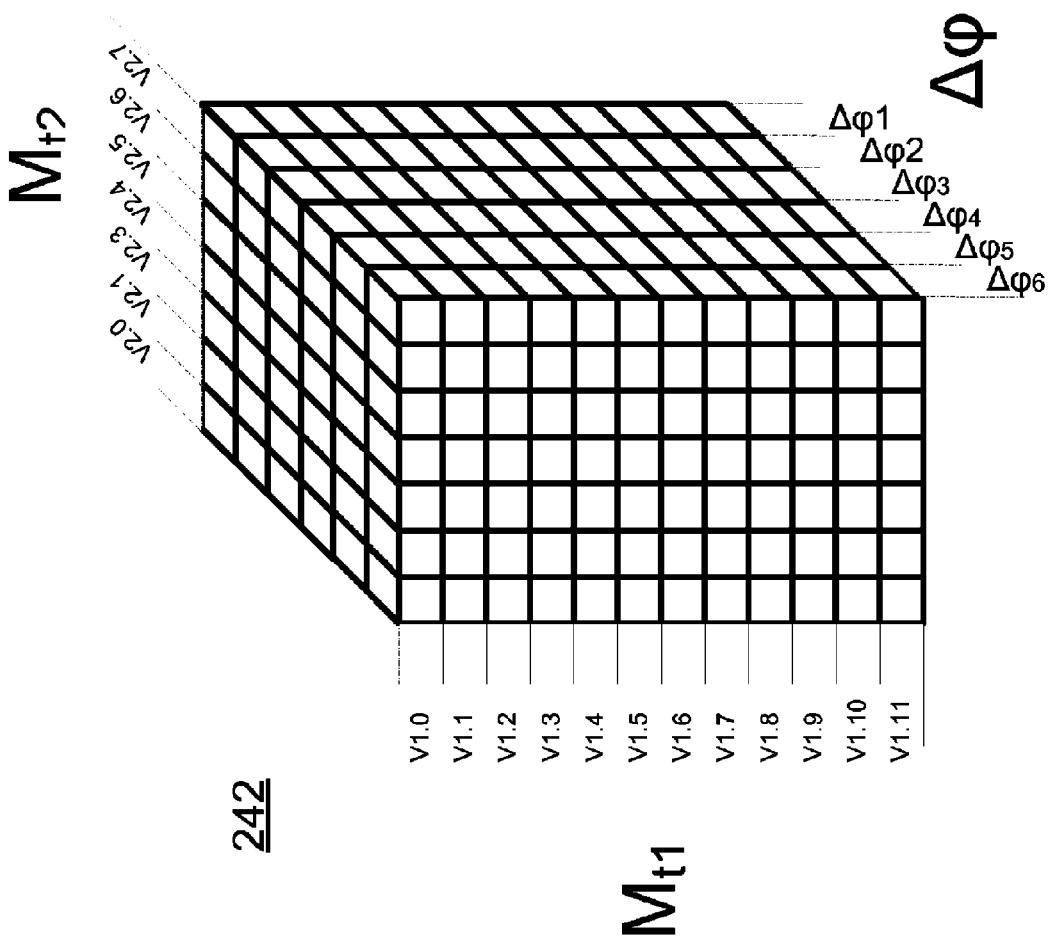
FIG. 2 illustrates a lookup table, according to an embodiment of the invention.

FIG. 2 illustrates lookup table 242, according to an embodiment of the invention. It is noted that the number of first indexes may differ from that of the second and/or third indices, and so on. According to an embodiment of the invention, the size of the lookup table is 8×16×32 (not as illustrated).

It is noted that the indexes may be organized in equal intervals (e.g. multiples $n \cdot M_0$ of a given magnitude value $M_0$ for a given set of consecutive integer n's), but this is not necessarily so.

Since only a finite (and possibly relatively small) number of indexes is used for each of the parameters, according to an embodiment of the invention signal processing module 220 is configured to process the input signal in response to at least one interpolated value that is determined in response to at least one filtering parameter and to at least one other filtering parameter, wherein the at least one other filtering parameter is retrieved from the lookup table using at least one lookup table index that is different from the first, the second, and the third lookup table indexes, and which is responsive to a parameter selected from a list consisting of the magnitude of the input signal at the first moment, the magnitude of the input signal at the second moment, and the phases of the input signal at the first and the second moments.

Referring again to FIG. 1 and to system 200, it is noted that signal processing module 220 may not always process the input signal in response to the at least one filtering parameter (or, it may process it in a trivial way such as multiplying it by a unit so as to keep it the same). Preventing of such processing in some of the cases (or enabling a simple trivial processing which does not substantially modify the input signal) may facilitate the amplification, reduce computational power, and may even reduce the number of interferences with the input signal, thus increasing a quality of the amplification.

For example, if the input signal is determined (by signal processing module 220 or a preceded module) to be of electrical parameters in which the amplification by power amplifier 250 will be substantially linear, processing may not be required.

According to an embodiment of the invention, signal processing module 220 (or another component of system 200) is further configured to determine in response to the input signal whether to process the input signal, signal processing module 220 is further configured to selectively process the input signal in response to a result of the determining.

The processing of the signal by signal processing module 220 is usually a continuous operation, in which in different times (and possibly at a rate that is equal to the sampling rate of the digital input signal) different filtering parameters are retrieved from lookup table 242, and used to process samples of the input signal at different times.

It is noted that the filtering parameters stored in lookup table 242 may be updated from time to time, either during operation (continuous filtering of an input signal)—possibly as result of the operation—or in an "off-line" manner.

According to an embodiment of the invention, system 200 includes table updating module 260 for updating one or more filtering parameters stored in lookup table 242. It is noted that according to an embodiment of the invention table updating module 260 may be a part of a filter updating module that control other parameters of signal processing module 220, e.g. a threshold for determining that processing of the input signal is required.

For example, according to several embodiments of the invention, the table updating module may update one or more filtering parameters stored in lookup table 242 (which may also be referred to as the table coefficients) by computing the filtering parameters using one of the following ways:

i. Using signal 102 and a feedback signal responsive to output signal 106, for calculating a cross signals error, and utilizing an adaptive algorithm to calculate the filtering parameters of lookup table 242 for eliminating the cross signals error.

ii. Using a post distorter Voltera polynomial to adaptively calculate the filtering parameters.

According to an embodiment of the invention, table updating module 260 is configured to update at least one filtering parameter of the lookup table in response to the amplified signal. According to such an embodiment of the invention, table updating module 260 may conveniently be configured to compare the amplified signal to the second signal (for compensating for non-linearities of power amplifier 250) or to the input signal (for compensating for non-linearities of signal processing module 220 and power amplifier 250). The updating by table updating module 260 conveniently includes updating a lookup table entry (one or more filtering parameters) that corresponds to the input signal amplified. It is noted that the comparison may pertain to a processed version of any of the above mentioned signal—e.g. a down-converted output signal, and so forth.

According to an embodiment of the invention, table updating module 260 is configured to update lookup table 242 in response to a physical condition of power amplifier 250. For example, in different operating temperatures, different filtering parameters may be used. Such updating may include retrieving data from other parts of memory module 240 (which may or may not have slower access times).

It is noted that the filtering parameters of lookup table 242 may be determined so as to bring the operation of signal processing module 220 closer to that of a known filter (e.g. a known pre-distorter of power amplifier 250 that may utilize more complex processing scheme). According to an embodiment of the invention, table updating module 260 is configured to write to lookup table 242 at least one filtering parameter that is determined by minimizing a difference between a signal processed using lookup table 242 (conveniently by signal processing module 220, but not necessarily as this process may be carried out off line) and a signal processed using another filter.

It is noted that the different aforementioned functionalities discussed in relation to table updating module 260 may be implemented using one or more filter updating modules, which may be a part of system 200, or external to it.

Figure 3:
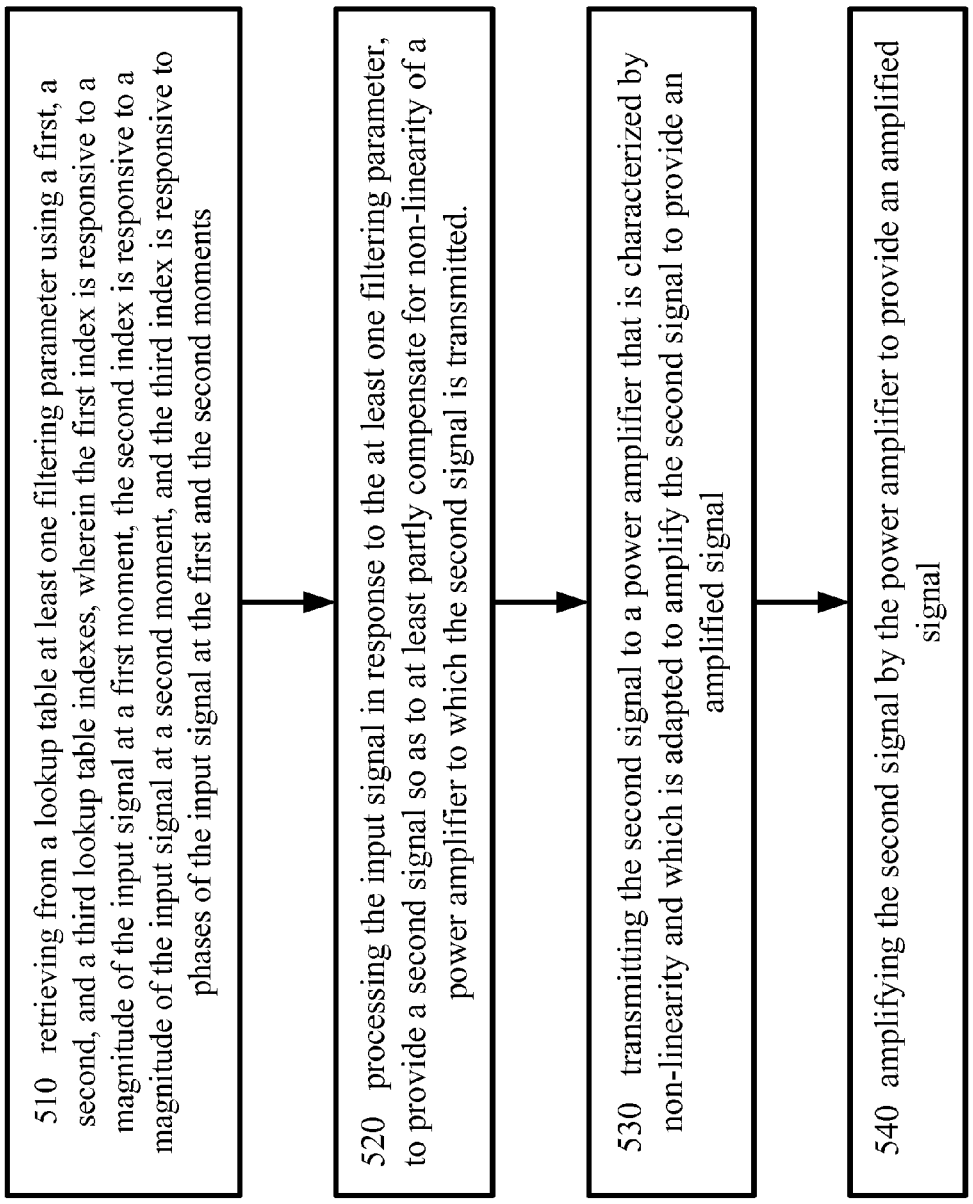
FIG. 3 illustrates a method for processing an input signal using a power amplifier that is characterized by non-linearity, according to an embodiment of the invention.

FIG. 3 illustrates method 500 for processing an input signal using, according to an embodiment of the invention.

Method 500 conveniently starts with stage 510 of retrieving from a lookup table at least one filtering parameter using a first, a second, and a third lookup table indexes, wherein the first index is responsive to a magnitude of the input signal at a first moment, the second index is responsive to a magnitude of the input signal at a second moment, and the third index is responsive to phases of the input signal at the first and the second moments.

Stage 510 is followed by stage 520 of processing the input signal in response to the at least one filtering parameter, to provide a second signal so as to at least partly compensate for non-linearity of a power amplifier to which the second signal is transmitted.

Stage 520 is followed by stage 530 of transmitting the second signal to a power amplifier that is characterized by non-linearity and which is adapted to amplify the second signal to provide an amplified signal.

According to an embodiment of the invention, method 500 may continue with stage 540 of amplifying the second signal by the power amplifier to provide an amplified signal.

According to an embodiment of the invention, the at least one filtering parameter consists of a complex compensation coefficient, wherein the processing includes multiplying the input signal by the compensation coefficient.

According to an embodiment of the invention, the retrieving includes retrieving the at least one filtering parameter from a three dimensional lookup table.

According to an embodiment of the invention, method 500 further includes updating at least one filtering parameter of the lookup table in response to the amplified signal. For example, according to several embodiments of the invention, the updating may include updating one or more filtering parameters stored the lookup table by computing the filtering parameters using one of the following ways:

i. Using the signal and a feedback signal responsive to the output signal, for calculating a cross signals error, and utilizing an adaptive algorithm to calculate the filtering parameters of the lookup table for eliminating the cross signals error.

ii. Using a post distorter Voltera polynomial to adaptively calculate the filtering parameters.

According to an embodiment of the invention, the retrieving includes retrieving the at least one filtering parameter from the lookup table that is implemented by hardware.

According to an embodiment of the invention, method 500 further includes updating the lookup table in response to a physical condition of the power amplifier.

According to an embodiment of the invention, the processing is preceded by determining in response to the input signal whether to process the input signal, wherein the processing is selectively carried out in response to a result of the determining.

According to an embodiment of the invention, the retrieving is preceded by determining at least one filtering parameter of the lookup table by minimizing a difference between a signal processed using the lookup table and a signal processed using another filter.

According to an embodiment of the invention, the first and the second moments are consecutive moments of a discrete sampling scheme.

According to an embodiment of the invention, the third index is responsive to a difference between the phases of the input signal at the first and the second moments.

According to an embodiment of the invention, method 500 further includes retrieving from the lookup table at least one other filtering parameter using at least one lookup table index that is different from the first, the second, and the third lookup table indexes, and which is responsive to a parameter selected from a list consisting of the magnitude of the input signal at the first moment, the magnitude of the input signal at the second moment, and the phases of the input signal at the first and the second moments; wherein the processing is responsive to at least one interpolated value that is determined in response to at least one filtering parameter and to at least one other filtering parameter.

It is noted that method 500 may conveniently be carried out by a system such as system 200. Referring to the examples set forth in the previous drawings, the retrieving may be carried out by memory unit 240, by signal processing module 220, or by a dedicated unit, the processing may be carried out by signal processing module 220, and the amplifying may be carried out by power amplifier 250. It is noted that different embodiments of system 200 may be implemented by corresponding embodiments of method 500, even if not explicitly elaborated, and vice versa.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A system for processing an input signal, the system comprising:
    a hardware memory module configured to store a lookup table; and
    a signal processing module, configured to process the input signal to provide a second signal, and to transmit the second signal to a power amplifier that is characterized by non-linearity and which is adapted to amplify the second signal to provide an amplified signal;
    wherein the signal processing module is configured to process the input signal in response to at least one filtering parameter to provide the second signal so as to at least partly compensate for the non-linearity of the amplifier; wherein the at least one filtering parameter is retrieved from the lookup table using a first, a second, and a third lookup table indexes, wherein the first index is responsive to a magnitude of the input signal at a first moment, the second index is responsive to a magnitude of the input signal at a second moment, and the third index is responsive to phases of the input signal at the first and the second moments;
    wherein the system comprises a delay circuit for delaying the input signal before the input signal is provided to the signal processing module.

2. The system according to claim 1, wherein the delay circuit is arranged to delay the input signal such as to arrive to the signal processing module when the at least one filtering parameter reaches the signal processing module.

3. The system according to claim 1, further comprising a table updating module, configured to update at least one filtering parameter of the lookup table by calculating a cross signals error, and utilizing an adaptive algorithm to calculate the at least one filtering parameter such as to eliminate the cross signals error.

4. The system according to claim 1, further comprising a table updating module, configured to update at least one filtering parameter of the lookup table by using a post distorter Voltera polynomial.

5. The system according to claim 1, wherein the system is arranged to sample the input signal more than once between the first and second moments.

6. The system according to claim 1, wherein the system is arranged to sample the input signal to provide a number of samples between the first and second moment and wherein the number changes between filtration of the input signal in different times.

7. A method for processing an input signal, the method comprising:
    retrieving from a lookup table at least one filtering parameter using a first, a second, and a third lookup table indexes, wherein the first index is responsive to a magnitude of the input signal at a first moment, the second index is responsive to a magnitude of the input signal at a second moment, and the third index is responsive to phases of the input signal at the first and the second moments;
    processing, by a signal processing module, the input signal in response to the at least one filtering parameter, to provide a second signal; and
    transmitting the second signal to a power amplifier that is characterized by non-linearity and which is adapted to amplify the second signal to provide an amplified signal; wherein the processing comprises processing the input signal to provide the second signal so as to at least partly compensate for the non-linearity of the amplifier,
    wherein the method comprises delaying the input signal before the input signal is provided to the signal processing module.

8. The method according to claim 7, comprising delaying the input signal such as to arrive to the signal processing module when the at least one filtering parameter reaches the signal processing module.

9. The method according to claim 7, further comprising updating at least one filtering parameter of the lookup table by calculating a cross signals error, and utilizing an adaptive algorithm to calculate the at least one filtering parameter such as to eliminate the cross signals error.

10. The system according to claim 7, further comprising updating at least one filtering parameter of the lookup table by using a post distorter Voltera polynomial.

11. The method according to claim 7, comprising sampling the input signal more than once between the first and second moments.

12. The method according to claim 7, comprising sampling the input signal to provide a number of samples between the first and second moment and wherein the number changes between filtration of the input signal in different times.

* * * * *